(12) United States Patent　(10) Patent No.: US 7,115,918 B2
Shen et al.　(45) Date of Patent: Oct. 3, 2006

(54) COLLECTOR LAYER STRUCTURE FOR A DOUBLE HETERO-JUNCTION BIPOLAR TRANSISTOR FOR POWER AMPLIFICATION APPLICATIONS

(75) Inventors: Shyh-Chiang Shen, Champaign, IL (US); David Charles Caruth, Champaign, IL (US); Milton Feng, Champaign, IL (US)

(73) Assignee: Xindium Technologies, Inc., Champaign, IL (US)

( * ) Notice: Subject to any disclaimer, the term of this patent is extended or adjusted under 35 U.S.C. 154(b) by 165 days.

(21) Appl. No.: 10/777,911

(22) Filed: Feb. 11, 2004

(65) Prior Publication Data

US 2005/0173730 A1　Aug. 11, 2005

(51) Int. Cl.
*H01L 29/737* (2006.01)
(52) U.S. Cl. .............................. 257/198; 257/E29.188
(58) Field of Classification Search ................ 257/198
See application file for complete search history.

(56) References Cited

U.S. PATENT DOCUMENTS

| 5,010,382 | A | * | 4/1991 | Katoh | ......................... | 257/15 |
| 5,572,049 | A | * | 11/1996 | Wen et al. | .................. | 257/197 |
| 6,563,145 | B1 | | 5/2003 | Chang et al. | | |
| 6,680,494 | B1 | | 1/2004 | Gutierrez-Aitken et al. | | |
| 2004/0169196 | A1* | | 9/2004 | Yanagisawa | ................ | 257/197 |

OTHER PUBLICATIONS

Hong Wang and Geok Ing Ng, "Investigation of the Degradation of InGaAs/InP Double HBTs Under Reverse Base-Collector Bias Stress," vol. 48, No. 11, IEEE Transactions on Electron Devices, pp. 2647-2654, Nov. 2001.
Hin-Fai Chau, Dimitris Pavlidis, Juntao Hu, and Kazutaka Tomizawa, "Breakdown-Speed Considerations in InP/InGaAs Single- and Double-Heterostructure Bipolar Transistors," vol. 40, No. 1, IEEE Transactions on Electron Devices, pp. 2-8, Jan. 1993.
Peter M. Asbeck, Frank Mau-Chung Chang, Keh-Chung Wang, Gerard J. Sullivan, and Derek T. Cheung, "GaAs-Based Heterojunction Bipolar Transistors for Very High Performance Electronic Circuits," vol. 81, No. 12, Proceedings of the IEEE, pp. 1709-1726, Dec. 1993.

* cited by examiner

*Primary Examiner*—Jerome Jackson
(74) *Attorney, Agent, or Firm*—Brinks Hofer Gilson & Lione

(57) ABSTRACT

An indium phosphide based double hetero-junction bipolar transistor with an increased collector-base breakdown voltage and a reduced operational knee voltage is provided by manipulating the conductivity in the collector region. The collector is formed using layers of different conductivities, with a region of the collector relatively close to the base being unintentionally or low doped. A voltage drop across the unintentionally doped region reduces the maximum value of the electric field and the velocity of carriers injected into the collector region at the base-collector junction. The conductivity throughout the collector region may be graded such that the highest conductivity occurs near the sub-collector and lowest conductivity occurs near the base region.

27 Claims, 5 Drawing Sheets

COLLECTOR LAYER STRUCTURE FOR A DOUBLE HETERO-JUNCTION BIPOLAR TRANSISTOR FOR POWER AMPLIFICATION APPLICATIONS

BACKGROUND

1. Technical Field

This invention relates to hetero-junction bipolar transistors, and more particularly, to double hetero-junction bipolar transistors used in power amplifiers.

2. Background Information

Hetero-junction bipolar transistors (HBTs) have been developed for high frequency power amplification systems such as mobile telephones and other mobile communication devices. While an HBT, like other transistors, includes an emitter, base, and collector, unlike conventional homojunction transistors (for example typical Si bipolar junction transistors) at least one of the emitter, base, and collector of an HBT are not formed of materials having the same bandgap. In single HBTs, the emitter and base materials are different to increase the flow of charged carriers (and thus current) in the desired direction between the emitter and base and decrease the flow of charged carriers of the opposite type in the reverse direction. A schematic of a general transistor structure is shown in FIG. 5, which shows the transistor 500, an emitter 502, a base 504, and a collector 506 as well as leads 510 from contact layers 508 on these respective portions of the transistor 500. In bipolar junction transistors, n-p-n transistors are formed using an emitter and collector doped with impurities that provide extra electrons and a base doped with impurities that provide extra holes.

In the past, the HBT has been produced primarily using gallium arsenide-based materials. Gallium arsenide-based materials are materials that include GaAs in binary, ternary or quaternary compositions. More specifically, previous HBTs include indium gallium arsenide (InGaAs) and aluminum gallium arsenide (AlGaAs). Although HBTs using these materials have been successfully incorporated into past communication devices, they remain unsatisfactory for future generation devices for a number of reasons. One of these reasons is that arsenide-based materials have relatively high thermal resistance, making them inadequate to meet the demands for the high power applications to be used in the new generation of devices, in which a large amount of heat will need to be extracted during operation.

Other HBTs have been produced using indium phosphide-based materials rather than gallium arsenide-based materials. Similar to the gallium arsenide-based HBTs, such indium phosphide-based HBTs include binary (indium phosphide i.e. InP), ternary or quaternary compositions. Indium phosphide-based HBTs have much lower thermal resistance than the gallium arsenide-based materials. Indium phosphide-based materials improve heat extraction during high power applications and exhibit the potential for high power gain in devices that require high bandwidth. However, due to the compositional structuring of the layers creating the HBTs, existing indium phosphide-based devices exhibit lower collector-base breakdown voltages than their arsenide-based material counterparts. The collector-base breakdown voltage is the maximum reverse bias voltage the collector-base diode can withstand before avalanche breakdown occurs, causing degradation of the transistor characteristics and/or destruction of the physical transistor. Avalanche breakdown is caused by the cumulative multiplication of charge carriers through electric field-induced impact ionization in the depletion region of the collector. In other words, at avalanche breakdown the electric field is large enough so that the charge carriers in the collector gain enough energy to create new pairs of electrons and holes essentially every time they collide with the atoms in the crystal structure. In HBTs used in high power applications, large electric fields are formed across the collector-base junction so that any charged carrier reaching this junction during operation is likely to undergo an avalanche-induced multiplication effect. Thus, it may be desirable to have a large collector-base breakdown voltage for high power applications.

In addition, knee voltages of HBTs used in high power applications are also of concern as these voltages are higher than desired. The knee voltage for a transistor is the point or area on a graph of emitter-base diode current versus voltage where the forward current suddenly increases. It is approximately equal to the barrier potential of the emitter-base diode. Stable operation of the HBT over a wider range of voltages may occur if the knee voltage in the HBT is decreased.

To decrease the amount of current from the collector to the base and thereby increase the gain of the transistor, double heterojunction bipolar transistors (DHBT) were developed. More specifically, InP DHBTs were designed to address many of the early challenges of current blocking. The material of the collector is different from that of the base to increase the offset between conduction and/or valence energy bands between the base and collector, to block the minority current and avoid recombination in the base region in a manner similar to the emitter-base junction. In these devices, the kinetic energies of the electrons (in n-p-n structures) entering the depletion region of the collector are far above the conduction band. Such large kinetic energies of the electrons, coupled with high electric fields, contribute to avalanche breakdown, propagating the creation of electron-hole pairs from impact ionization and causing low base-collector breakdown voltages. Thus, these design changes have not reduced the problem of high operating knee voltages and low collector-base breakdown voltages. Rather, the current DHBT structures have only served to complicate these two characteristics, thus restricting the ability of InP-based materials to realize their superior current handling capability for power applications.

BRIEF SUMMARY

Embodiments of the invention thus provide an InP-based double hetero-junction bipolar transistor (DHBT) that has superior current handling capabilities and reduces the maximum electric field in the base-collector region, resulting in a higher breakdown voltage while maintaining a low operating knee voltage. This device improves these characteristics by manipulating the design of the collector. Since the low collector-base breakdown voltage is one of the problems responsible for the degradation and destruction of the InP-based transistor devices in power applications, the parameters in the collector are primarily addressed in the present document.

In the present embodiments, the DHBT contains a collector region with different compositional material from that used previously and thin spacer materials between the collector and base. This improved DHBT provides a collector structure that addresses and reduces the electric field and high kinetic energies that contribute to the reduction of the breakdown voltage. In one embodiment, the doping in a region of the n-type collector is manipulated such that the intentionally introduced donor impurities are substantially reduced or eliminated altogether in a region of the collector near the base, making the electric field more uniform throughout that portion of the collector.

In one embodiment, the discontinuity of the conduction bands at the transition of the quaternary layers between the base and the collector layers is reduced because of the low doped or undoped region. When the collector has a region of doping which is low (in one specific aspect, carrier concentrations of at most in the low $10^{16}$ cm$^{-3}$ range) or undoped, the carriers enter the collector region at velocities that may be slightly reduced when compared with the unimproved transistor. Even this reduction in velocity of carriers entering the collector and the reduction in the electric fields in that region increases the base-collector breakdown voltage. This technique in bandgap engineering is accomplished by grading the doping concentration either gradually or in steps through the collector from the sub-collector region towards the base.

In another embodiment, the introduction of an unintentionally doped or very lightly doped layer in a well-defined region nearest the base also reduces the electric field at the base-collector junction. The insertion of such a layer may be a much more practical solution based on the difficulty of controlling doping impurities at low levels.

BRIEF DESCRIPTION OF THE DRAWINGS

The invention can be better understood with reference to the following diagrams. The graphs and drawings are not necessarily to scale but instead place an emphasis upon the principles of the invention.

DETAILED DESCRIPTION OF THE DRAWINGS AND THE PRESENTLY PREFERRED EMBODIMENTS

Embodiments of the present invention provide changes in the collector structure of an indium phosphide (InP) based double hetero-junction bipolar transistor (DHBT) that increases the collector base breakdown voltage and reduces the operating knee voltage. Historically, these two operating characteristics have been difficult to control in order to realize the advantages of the otherwise superior performance parameters of InP for power amplification applications. High frequency mobile devices that provide the bandwidth for higher data rates have become increasing desirable, and suitable power amplifiers for those devices are difficult to engineer into small packages.

InP based DHBT devices provide low thermal resistance with a high power gain compared with the conventional gallium arsenide (GaAs) based devices. When the device is operated at high power levels it is desirable to remove the heat from the device to avoid performance degradation. GaAs devices make use of the connecting leads to help draw the heat away from the active devices. Devices grown on indium phosphide substrates however may utilize the substrate to conduct heat away from the device in larger amounts, thereby permitting the device to operate under higher power conditions and/or for longer without problems occurring. As third generation (3G) handsets become prevalent and more demands are made upon the power amplifiers, the advantages of the InP DHBT become apparent. However, a complex combination of layer structures and processing techniques to carry out those structures may be used to realize the advantages of the InP-based materials.

A good InP DHBT has a reasonably high current gain for good power amplification, a low knee voltage, a high breakdown voltage, insignificant current blocking at the intended operating current density, and is hopefully relatively easy to manufacture. The current gain of the transistor may affect the power added efficiency (PAE) to a small extent, however the breakdown voltage and knee voltage have become major concerns when it comes to the PAE of the transistor.

The collector-to-emitter breakdown voltage ($BV_{CEO}$) may be expressed as:

$$BV_{CEO} = (1+M)^{1/\beta} * BV_{CBO}$$

where M is the carrier avalanche multiplication factor of a particular material, $\beta$ is the common emitter current gain, and $BV_{CBO}$ is the collector-to-base breakdown voltage with an emitter open circuit. Given a particular material system and a base design, the $BV_{CBO}$ may be closely related to the $BV_{CEO}$, therefore the design of an InP power DHBT focuses on the collector.

Figure 5:
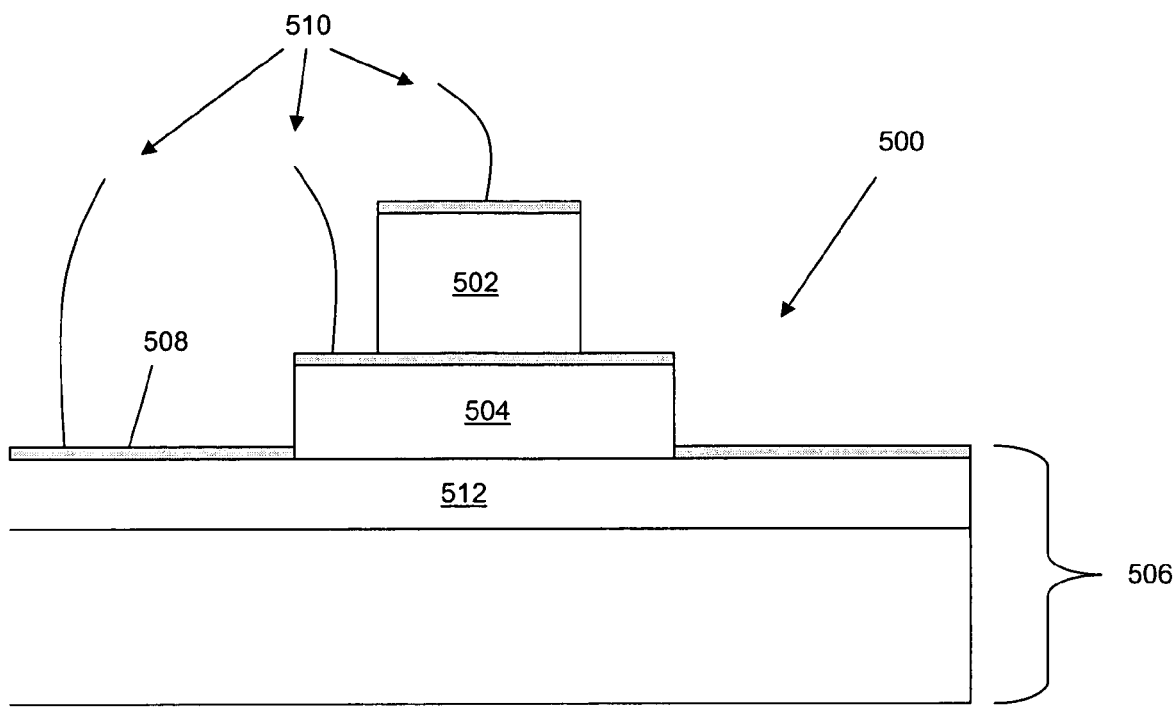
FIG. 5 is a basic transistor structure.

A typical DHBT is also represented by the structure 500 in FIG. 5. The collector 506 is shown with an unintentionally doped region 512 of the collector inserted just below the gate region. This diagram illustrates another embodiment in that the transitional region is not necessary to make this device work. Further, the dimension of the unintentionally doped region 512 is not to scale and may be of varying lengths.

Figure 1:
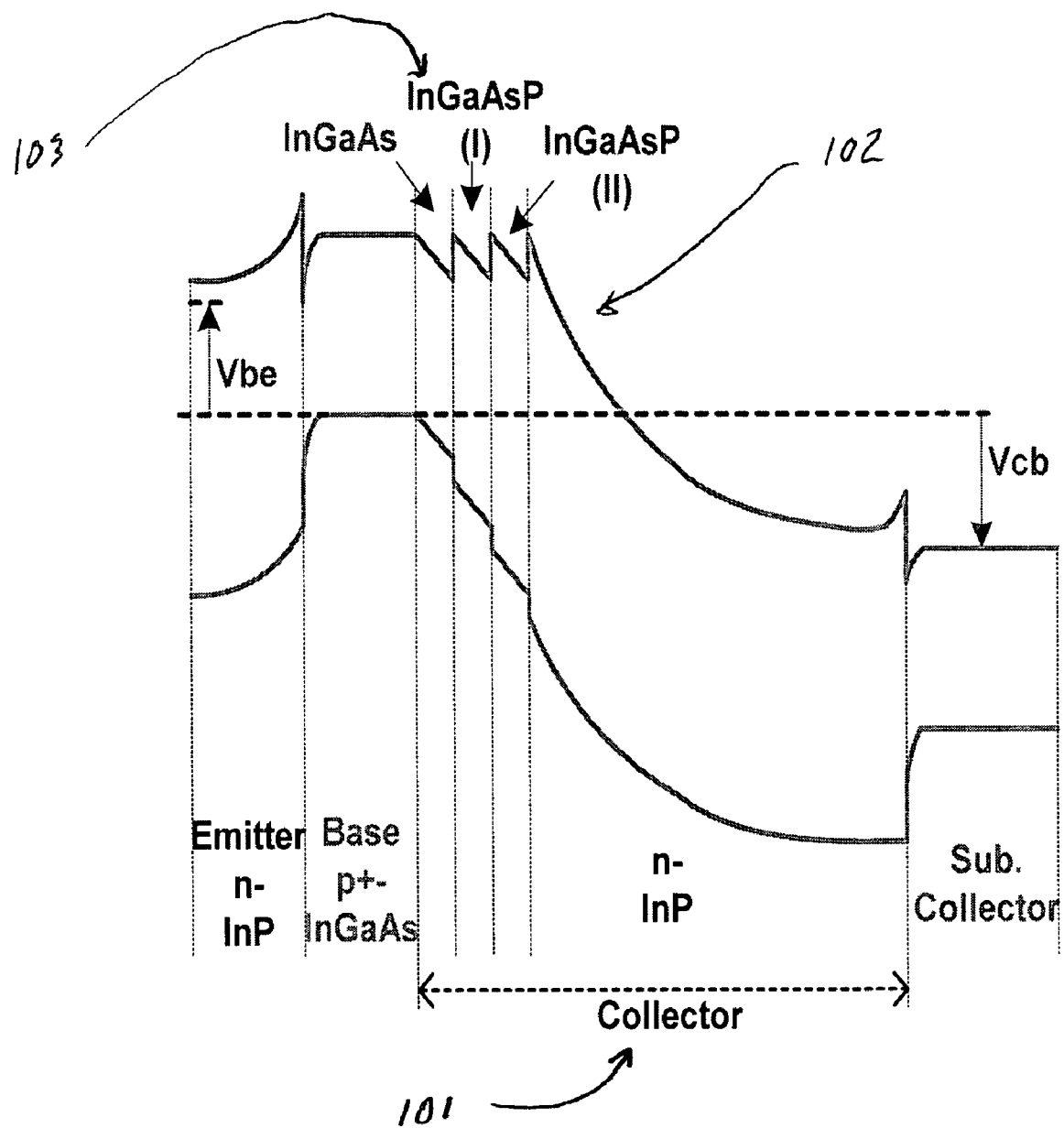
FIG. 1 is an energy bandgap diagram for a prior art DHBT.
Figure 2:
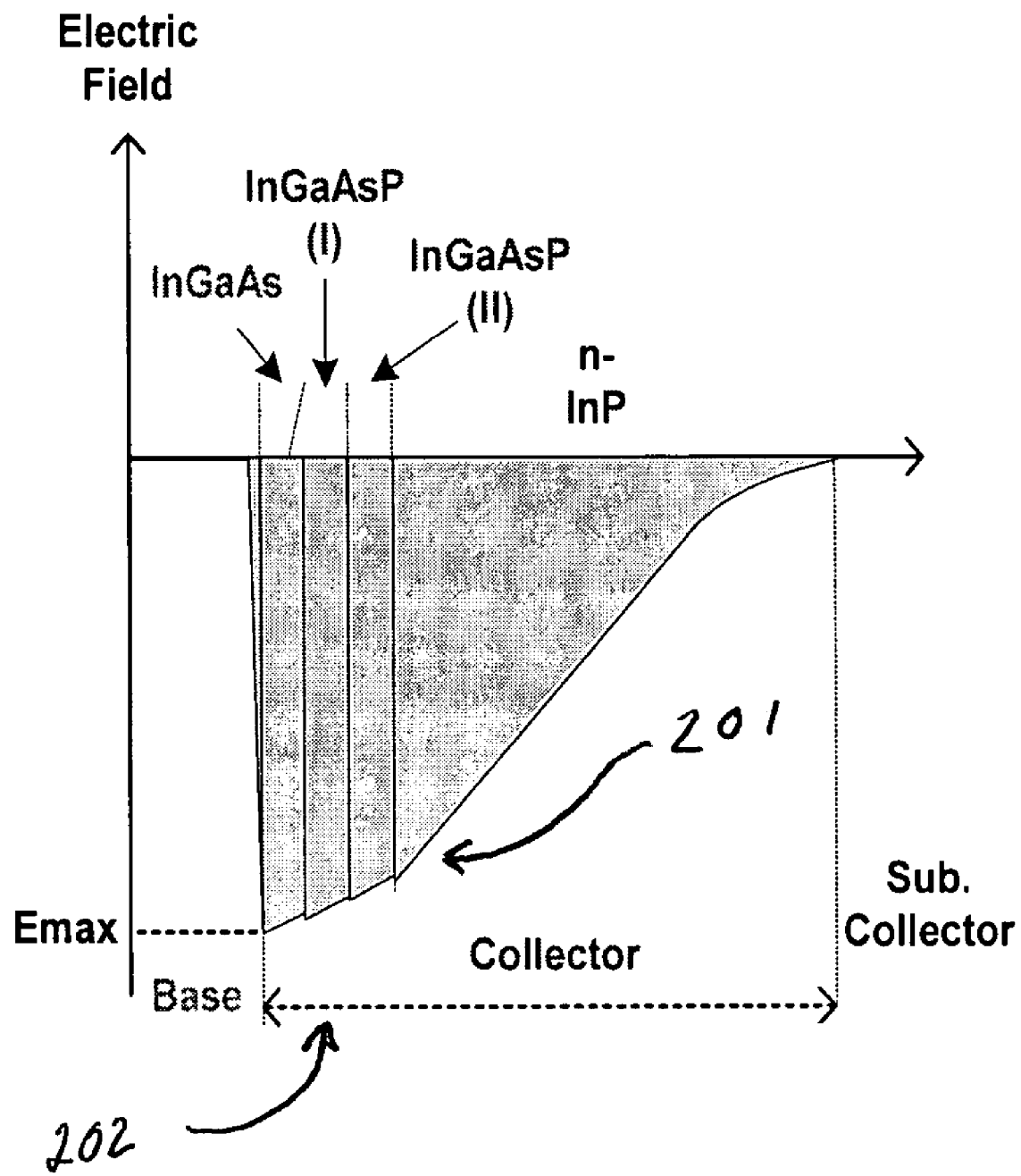
FIG. 2 is an electric field graph for the prior art DHBT.

A typical InP DHBT band diagram is shown in FIG. 1. The electric field distribution for this transistor 200 is shown in FIG. 2. Generally, the base-collector junction 102 experiences the highest value 201 for the electric field, and this is the physical point where the device breakdown may be initiated. From Poisson's equation, the applied external voltage ($V_{CB}$) to the collector-base region may be expressed as follows;

$$V_{CB} = \int\int [\rho(x)/\in(x)] dx^2$$

where $\rho(x)$ and $\in(x)$ are the space charge and the dielectric constant within the depletion regions respectively.

Shown in FIGS. 1 and 2 a doped InP collector results in a steep slope 102 for the exponential-shaped conduction band. Further, the electric field shows a steeper slope 201 in the doped region of the collector 102 as compared with the electric field 202 of the unintentionally doped (also called undoped) ternary/quaternary transition regions formed from InGaAs, AlGaInAs or InGaAsP. The layers may be lightly doped in some instances to a carrier concentration of about 5E16. The effect of the electric field is concentrated in the base-collector region and stresses the material. The stresses of the field, coupled with impact ionization of the high kinetic energy electrons injected into the region, results in an early junction breakdown even before the electric field would reach the nominal breakdown field intensity expected for avalanche breakdown in InP. Thus, one of the advantages for using InP as the high-breakdown field collector is compromised.

In combination with a high current gain, a non-depleted collector at low bias voltages may contribute to increases in the knee voltage. In order to increase the breakdown voltage, the normal doping levels of a collector may remain low, and the thickness of the collector may be increased. These low doping values result in a high series resistance. When the collector is designed to be relatively long, the series resistance in combination with the high collector current densities results in an even higher value for the knee voltage. In order to reduce this series resistance, and consequently the knee voltage, the doping in the collector may be increased. As discussed above, increasing the doping in the collector decreases the electric field throughout the collector and thus, at the base-collector junction, the electric field may increase. Again, the advantages of using InP are lost.

Figure 3:
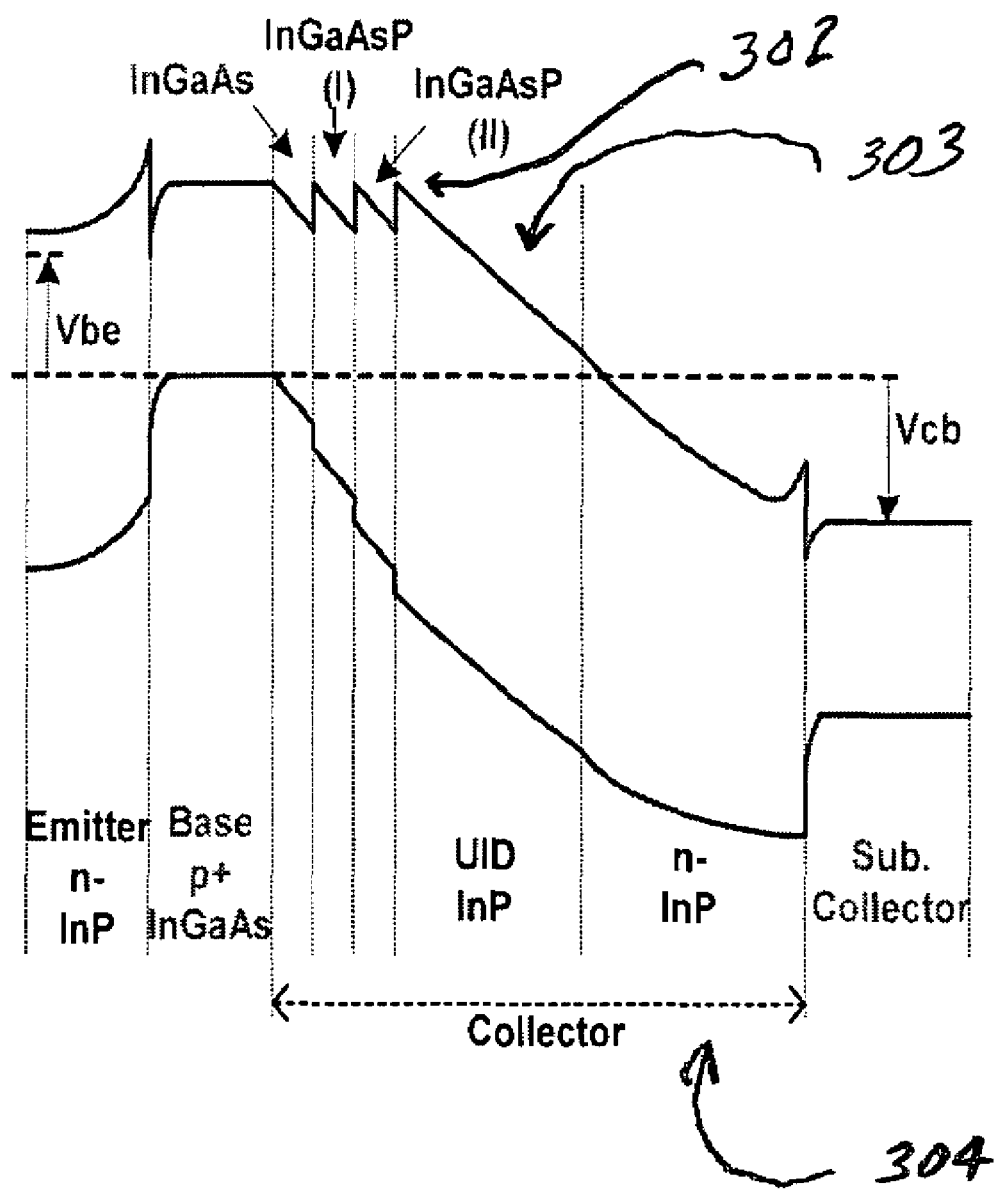
FIG. 3 is an energy-band diagram for the DHBT.

FIG. 3 is an energy band diagram for the DHBT with an unintentionally doped collector region 303 inserted into the device. By carefully incorporating this unintentionally doped layer 303 into the structure, the high breakdown voltage, low knee voltage, and a reasonably fast device may be achieved, all simultaneously. The insertion of the undoped layer 303 increases the resistance of the collector 101. However, with an increase in the collector resistance, a larger voltage drop occurs across the inserted layer 303. This permits a higher percentage of the voltage drop to occur across the portion of the collector that is undoped.

Figure 4:
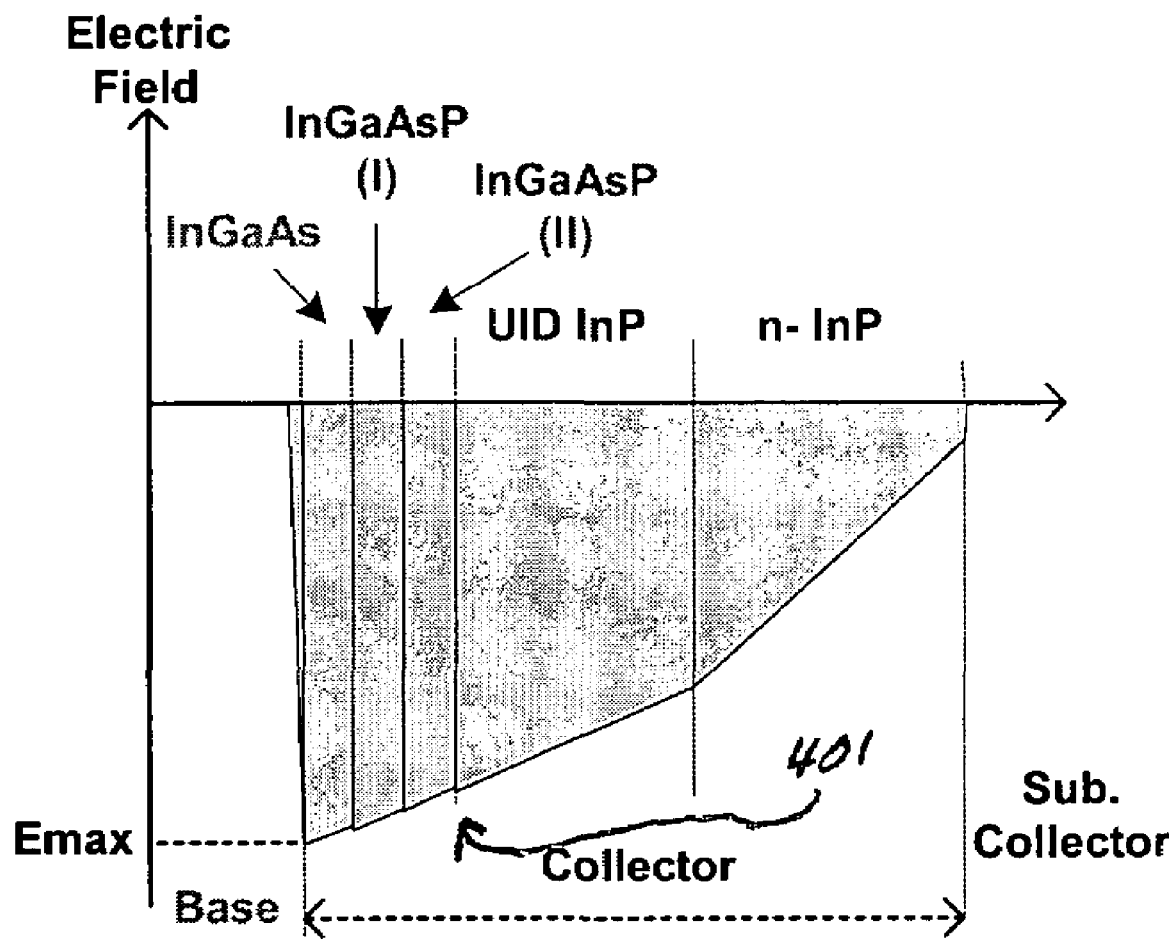
FIG. 4 is an electric field graph for the DHBT.

The area under both the curves as shown in FIGS. 2 and 4 represent the total electric field. Since the area is the same for a given voltage, the electric field remains the same in both cases. However, each of the curves illustrate that the maximum value 401 of the electric field for the device with the unintentionally doped layer is reduced from that value 201 obtained from the device having an intentionally doped layer. Therefore, the introduction of an unintentionally doped layer may serve to reduce the intensity of the electric field at the base-collector junction. This may allow and increase in the device breakdown voltage without increasing the thickness of the collector or lowering the dopant level across the whole collector region.

In fact, by optimizing the position of the electric field in the collector with the insertion of the unintentionally doped collector layer, the potential to increase the doping in other portions of the collector exists. Adding to the concentration of the carriers in this region may serve to reduce the overall series resistance. A reduction in the series resistance leads to both a reduction in the voltage drop across the collector and the operational knee voltage for the device. However, a tradeoff exists as reducing the doping in this region serves to further increase the electric field across the undoped region of the collector and this increase in the electric field may offset any increase realized in the breakdown voltage that would otherwise be gained by the insertion of the undoped layer.

The DHBT shown has several layers of materials incorporated into the structure so that the device will perform as intended. Many of the materials having different energy band levels, as well as varying levels of conductivity, are incorporated into the device to make the carriers perform in a desirable manner. A structure of a known InP-based DHBT is provided in Table 1. In this structure, the collector thickness is approximately 760 nm. Here there is no unintentionally doped layer of InP in the collector region. The doping level throughout the collector remains at approximately $2E16$ $cm^{-3}$, except a portion of the collector nearest the base region that has a doping spike of about $1E17$ $cm^{-3}$. The energy band diagram of FIG. 1 and the electric field graph of FIG. 2 are representative of the structure in Table 1.

In FIG. 1, the conduction band for the base-collector region 102 is shown to have a steep, nonlinear curve. Thus the injected carriers, or electrons, entering the collector region have high velocities. When these carriers with a high kinetic energy strike the lattice, they may generate electron-hole pairs that may contribute to the overall current. Even these new, generated electron-hole pairs may strike the lattice with enough energy to create other electron-hole pairs until a cascading effect takes over and the junction breaks down. Additionally, the electric field is elevated at the base-collector junction 102 contributing to the stress of the material at this region. Of course the electric field further affects the carriers and their kinetic energy, accelerating the breakdown of the device.

TABLE 1

Standard InP DHBT structure

| | Material | Mole Fraction | Bandgap (eV) | Thickness (nm) | Type | Dopant | Concentration (cm-3) |
|---|---|---|---|---|---|---|---|
| 14 | In(x)GaAs(Cap) | x = 0.53 | | 100 | N+ | Si | 2E19 |
| 13 | InP (Emitter) | | | 20 | N+ | Si | 5E18 |
| 12 | InP (Emitter) | | | 75 | N | Si | 3E17 |
| 11 | In(x)GaAs (Emitter) | x = 0.53 | | 5 | N | Si | 3E17 |
| 10 | InP (Emitter) | | | 25 | N | Si | 3E17 |
| 9 | In(x)GaAs (Base) | x = 0.53 | | 50 | P | C | 3E19 |
| 8 | In(x)GaAs (Spacer) | x = 0.53 | | 35 | UID | | <1E15 |
| 7 | InGaAsP (Step Graded 1) | | 0.9 | 15 | UID | | <1E16 |
| 6 | InGaAsP (Step Graded 2) | | 1.1 | 15 | UID | | <1E16 |
| 5 | InP | | | 12 | N | Si | 1E17 |
| 4 | InP (Collector) | | | 755 | N− | Si | 2E16 |
| 3 | In(x)GaAs (Sub-Collector) | x = 0.53 | | 100 | N+ | Si | 2E19 |
| 2 | InP (Sub-Collector) | | | 300 | N+ | Si | 2E19 |
| 1 | In(x)GaAs (Etch Stop) | x = 0.53 | | 10 | UID | | |
| 0 | InP Substrate | S.I. Fe-doped | | — | | | — |

The layer structure for the improved InP-based DHBT is illustrated in Table 2. As in Table I, carrier concentrations and other characteristics in the various are values at 300 K. The carrier concentrations and/or conductivities may be measured by any means, Hall Effect, C—V profiling, Secondary Ion Mass Spectroscopy (SIMS), etc. The unintentionally doped layer is inserted into the collector in a region near the base, but the overall thickness of the collector remains the same. FIG. 4 illustrates that a reduction in the maximum value of the electric field may be provided at the base-collector junction 401. This is readily apparent when compared with the maximum value 204 in FIG. 2.

Further, the energy conduction band of the device with the unintentionally doped layer may show some linearity over the region of the unintentional doping 303 in the collector. When compared to the device with the doped collector 102 in FIG. 1, the steepness of the conduction band is softened somewhat from the exponential curve in FIG. 1. This demonstrates that the kinetic energy, and thus the velocity, of the injected electrons may not be as great when comparing the improved device against the device without the inserted layer. Therefore, the unintentionally doped layer, when inserted into the collector of the InP DHBT, may serve to increase the breakdown voltage while at the same time, reduce the operational knee voltage of the transistor.

In the epitaxial growth processes, although the highest purity of all source material is sought, there is, due to previous layer growths, some molecular residual material remaining in the growth area that may contaminate the following layers as they are grown. This residual material originates either from the most recent layer that was grown, especially in the region around the susceptor, or through the adherence of the molecules from the source material to the internal surfaces of the reactor. The polar form of some source material molecules may be responsible for the adherence. The residual material may manifest itself in the constituents that make up the layer material, the free radicals that were formed during the growth or the dopant material that was used in the previous layers. These are called memory effects.

TABLE 2

New InP DHBT Structure

| | Material | Mole Fraction | Bandgap (eV) | Thickness (nm) | Type | Dopant | Concentration (cm-3) |
|---|---|---|---|---|---|---|---|
| 15 | In(x)GaAs(Cap) | x = 0.53 | | 100 | N+ | Si | 2E19 |
| 14 | InP (Emitter) | | | 20 | N+ | Si | 5E18 |
| 13 | InP (Emitter) | | | 75 | N | Si | 3E17 |
| 12 | In(x)GaAs (Emitter) | x = 0.53 | | 5 | N | Si | 3E17 |
| 11 | InP (Emitter) | | | 25 | N | Si | 3E17 |
| 10 | In(x)GaAs (Base) | x = 0.53 | | 55 | P | C | 3E19 |
| 9 | In(x)GaAs (Spacer) | x = 0.53 | | 35 | UID | | <1E15 |
| 8 | InGaAsP (Step Graded 1) | | 0.9 | 20 | UID | | <1E16 |
| 7 | InGaAsP (Step Graded 2) | | 1.1 | 15 | UID | | <1E16 |
| 6 | InP | | | 12 | N | Si | 1E17 |
| 5 | InP | | | 250 | UID | Si | <1E16 |
| 4 | InP (Collector) | | | 500 | N– | Si | 3E16 |
| 3 | In(x)GaAs (Sub-Collector) | x = 0.53 | | 100 | N+ | Si | 2E19 |
| 2 | InP (Sub-Collector) | | | 300 | N+ | Si | 2E19 |
| 1 | In(x)GaAs (Etch Stop) | x = 0.53 | | 10 | UID | | |
| 0 | InP Substrate | S.I. Fe-doped | | — | | | — |

The method for inserting the unintentionally doped collector layer may be accomplished through epitaxial crystal growth. Starting with a crystalline substrate, each layer is deposited upon the next by introducing source materials to a heated growth chamber that provides the conditions that allow the formation of the requisite layers. Further, each layer may be closely matched in lattice constant so that the material generally remains crystalline throughout.

An epitaxial layer may be defined as a layer where new source materials are introduced to grow entirely different material compositions or where the dopant flow is changed to grow layers with different electrical characteristics. The characteristics may be n-type or p-type materials or just a change in conductivity level. However, some changes can be much more subtle in order to get the correct material parameters, and they may be necessary to make a device. Some of these subtle changes may include parameters such as chamber pressure, line pressure, growth temperature, source flow, etc. They may just include a period of no growth or just the fact that the computer cycled into a new layer program where nothing changed from the last layer. These are all tools available to the crystal grower in order to extract the proper material characteristics.

Methods for the growth and deposition of epitaxial layers include metal-organic vapor phase epitaxy (MOVPE), also commonly known as metal-organic chemical vapor deposition (MOCVD), molecular beam epitaxy (MBE), vapor phase epitaxy (VPE), and liquid phase epitaxy (LPE).

Due to these memory effects in the epitaxial reactors, especially those within the reactor chamber where the layer structures for the DHBT transistor are grown, it may be difficult in practice to achieve the desired targeted doping profile. This is so even when there was very little dopant material used in the previous layers as compared to the source material used for the bulk layers. Dopant memory effects within the reactor can also come from the dopant material clinging to the walls of the tubing, valve switching blocks and the reactors themselves. Often, the material deposited on the susceptor from the previous layer growths may contribute to auto-doping of the wafer.

Auto-doping is a phenomenon of doping where the currently growing crystals are doped by dopant material existing within the materials on the walls and from the previously grown material on the susceptor. This effect is primarily due to the heat, and the governing laws of thermodynamics, that cause the migration of the dopant out of the material pre-existing on the susceptor and back into the wafer. This effect may make control of the doping levels difficult and run-to-run reproducibility unmanageable.

Since continuous grading for the doping material may be difficult to accomplish, alternative designs include those where a plurality of layers are grown and the doping level in each follow-on layer is reduced. This stair-step method very closely approximates the continuously graded doping decrease throughout the collector. Of course, the same problem may exist as that in the graded doping. As the lowest doped layers are grown, the memory effect within the reactor may prevent the target doping of these layers from being achieved.

Autodoping and the memory effects of the reactor may prevent the accomplishment of targeted doping levels, even though the memory effect can and may eventually clear itself up if given enough time. As the dopant materials are buried by the subsequent material growth, migration of the dopant and the auto-doping effect may become less pronounced. The material clinging to the interior walls of the reactor and tubing will deplete itself to a point where it becomes ineffective as a dopant. It is at this point that the crystalline material may become undoped or intrinsic.

Therefore, an unintentionally doped layer may actually be slightly doped from auto-doping effects, but as the growth proceeds, the sources for the auto-doping and memory effect will deplete themselves. Such an unintentionally doped layer, although not ideal, may effectively mimic and accomplish the goals of the preferable grading.

In a DHBT, the sub-collector is the first layer grown, and it is doped very heavily. Unless the dopant source is not polar, it should clear the growth chamber quickly. However, in the area around the wafer there exist surfaces where amorphous material representing the sub-collector was grown and that material is doped. Because of this amorphous material, auto-doping may be fairly prevalent during the growth of any subsequent collector layers. Until this material is sealed by the subsequent growths, auto-doping may be a factor. The reactor design will dictate the severity of the autodoping.

In the DHBT, placement of the unintentionally doped layer 512 between the transitional quaternary layer and the doped portion of the collector 304 may effectively lower the maximum electric field at the base-collector junction and improve the device breakdown characteristics. Since only a small percentage of the collector region is unintentionally doped (Table 2, line 5) or at the very least, has a low impurity doping concentration, then the series resistance is not severely increased. As a result, the knee voltage may be optimized at reasonable values.

In another embodiment that achieves an increase in the breakdown voltage and reduces the knee voltage, it is also possible to grade the doping in the doped portion of the collector either continuously or within a series of layers. Since the portion of the collector closest to the sub-collector is heavily doped and the doping generally decreases as it approaches the unintentionally doped layer, this method still assures a minimal series resistance at the end of the collector closest to the sub-collector. The memory effect still may be prevalent, but as the reactor decreases dopant source flow, the sources for the memory effect also deplete from the higher concentrations of dopant within the system as the growth progresses. When the unintentionally doped layer begins to grow, the system may have depleted the residual materials from the high doping levels previously grown, but must still flush those from the lower levels.

In another embodiment of the method for clearing the system and reducing the memory effects, a method especially effective for allowing the inner walls of the switching manifolds and the growth lines to deplete themselves of source material, is to pause the growth for anywhere from a few seconds to a couple of minutes. By doing so, the carrier gas may carry the source material to a vent and by-pass the growth chamber altogether. Conceivably, purer material may be grown without the background doping effects. However, these growth interruptions may create other problems at the interface when growth begins once again as random defects and other impurities may have settled onto the interface.

Other methods for growing unintentionally doped materials, where the achieved doping levels become very low in the collector region, may become obvious to one skilled in the art. These may be manifested in total flow rates, temperature changes, growth chamber pressure and line pressures during the growth of each of the individual layers.

It is therefore intended that the foregoing detailed description be regarded as illustrative rather than limiting, and that it be understood that it is the following claims, including all equivalents, that are intended to define the spirit and scope of this invention.

The invention claimed is:

1. An indium phosphide-based semiconductor double hetero-structure bipolar transistor comprising:
   an emitter region having a first bandgap;
   a base region in electrical communication with the emitter region, the base region having a second bandgap different from the first bandgap;
   a collector region containing indium and phosphorous and in electrical communication with the base and the emitter regions, the collector region having a third bandgap different from the second bandgap, the collector region containing at least three layers having different carrier concentrations; and
   a sub-collector in electrical communication with the collector region, wherein the collector region comprises a first layer, a second layer adjacent to the first layer that has a lowest carrier concentration of the three layers, and a third layer adjacent to the second layer that has a highest carrier concentration of the three layers, and the first layer is closer to the sub-collector than either the second or third layers.

2. The transistor as recited in claim 1, wherein the second layer is an unintentionally doped layer.

3. The transistor as recited in claim 1, wherein a ratio of carrier concentrations of the first layer to the second layer is at least about 3.

4. The transistor as recited in claim 1, wherein a ratio of carrier concentrations of the third layer to the first layer is at least about 3.

5. The transistor as recited in claim 1, wherein a ratio of carrier concentrations of the third layer to the second layer is at least about 10.

6. The transistor as recited in claim 1, wherein the first layer is donor doped and has a carrier concentration of about 3E 16 $cm^{-3}$.

7. The transistor as recited in claim 1, wherein the first layer is about 500 nm thick.

8. The transistor as recited in claim 1, wherein the second layer has a carrier concentration level at most about 1E16 $cm^{-3}$.

9. The transistor as recited in claim 1, wherein the second layer is about 250 nm thick.

10. The transistor as recited in claim 1, wherein the first layer has a substantially uniform carrier concentration.

11. The transistor as recited in claim 1, wherein the first layer has a graded carrier concentration that increases with increasing distance from the second layer.

12. The transistor as recited in claim 11, wherein the carrier concentration in the first layer is continuous across substantially the entirety of the first layer.

13. The transistor as recited in claim 1, wherein the collector region further comprises at least one additional layer disposed between the first layer and the sub-collector, a carrier concentration of the additional layer greater than the carrier concentration of the first layer.

14. The transistor as recited in claim 13, wherein a plurality of additional layers are disposed between the first layer and the sub-collector, carrier concentrations of the additional layers increasing with increasing distance from the first layer.

15. The transistor as recited in claim 14, wherein the carrier concentrations of the additional layers are substantially constant throughout each of the additional layers.

16. The transistor as recited in claim 14, wherein the carrier concentration of at least one of the additional layers is graded.

17. An indium phosphide-based semiconductor double heterostructure bipolar transistor comprising:

an emitter region having a first bandgap;

a base region in electrical communication with the emitter region, the base region having a second bandgap different from the first bandgap; and a collector region in electrical communication with the base and emitter regions, the collector region having a third bandgap different from the second bandgap;

a sub-collector in electrical communication with the collector region, wherein the collector region contains indium and phosphorous, the collector region containing at least three layers having different conductivities; and a sub-collector in electrical communication with the collector region, wherein the collector region comprises a first layer, a second layer adjacent to the first layer that has a lowest conductivity of the three layers, and a third layer adjacent to the second layer that has a highest conductivity of the three layers, and the first layer is closer to the sub-collector than either the second or third layers.

18. The transistor as recited in claim 17, wherein the second layer is an unintentionally doped layer.

19. The transistor as recited in claim 17, wherein the first layer is donor doped and has a carrier concentration of about $3E16$ $cm^{-3}$.

20. The transistor as recited in claim 17, wherein the second layer has a carrier concentration at most about $2E16$ $cm^{-3}$.

21. The transistor as recited in claim 17, wherein the first layer has a substantially uniform conductivity.

22. The transistor as recited in claim 17, wherein the first layer has a graded conductivity that increases with increasing distance from the second layer.

23. The transistor as recited in claim 22, wherein the conductivity in the first layer is continuous across substantially the entirety of the first layer.

24. The transistor as recited in claim 17, wherein the collector region further comprises at least one additional layer disposed between the first layer and the sub-collector, a conductivity of the additional layer greater than the conductivity of the first layer.

25. The transistor as recited in claim 24, wherein a plurality of additional layers are disposed between the first layer and the sub-collector, conductivities of the additional layers increasing with increasing distance from the first layer.

26. The transistor as recited in claim 25, wherein the conductivities of the additional layers are substantially constant throughout each of the additional layers.

27. The transistor as recited in claim 25, wherein the conductivity of at least one of the additional layers is graded.

* * * * *